United States Patent [19]

Nakayama et al.

[11] Patent Number: 5,334,282
[45] Date of Patent: Aug. 2, 1994

[54] ELECTRON BEAM LITHOGRAPHY SYSTEM AND METHOD

[75] Inventors: Yoshinori Nakayama, Sayama; Shinji Okazaki, Urawa, both of Japan

[73] Assignee: Hitachi, Ltd., Tokyo, Japan

[21] Appl. No.: 765,252

[22] Filed: Sep. 25, 1991

[30] Foreign Application Priority Data

Sep. 28, 1990 [JP] Japan .................. 2-256899

[51] Int. Cl.⁵ .......................................... A61K 27/02
[52] U.S. Cl. ..................... 156/643; 156/659.1; 430/5; 250/492.1; 250/492.2; 250/492.3; 250/505.1
[58] Field of Search ............ 430/5; 156/643, 659.1; 250/492.2, 492.3, 492.1, 505.1

[56] References Cited

U.S. PATENT DOCUMENTS

| | | | |
|---|---|---|---|
| 4,158,140 | 6/1979 | Nakasuji | 250/492.2 |
| 4,213,053 | 7/1980 | Pfeiffer | 250/492.2 |
| 4,344,153 | 8/1982 | Nishida et al. | 365/39 |
| 4,520,269 | 5/1985 | Jones | 250/492.2 |
| 4,698,509 | 10/1987 | Wells et al. | 250/492.2 |
| 4,812,962 | 3/1989 | Witt | 364/190 |
| 4,947,413 | 8/1990 | Jewell et al. | 250/492.2 X |
| 4,998,020 | 3/1991 | Misaka et al. | 250/492.2 X |

FOREIGN PATENT DOCUMENTS 59-169131 9/1984 Japan .
60-66429 4/1985 Japan .

*Primary Examiner*—Thi Dang
*Attorney, Agent, or Firm*—Fay, Sharpe, Beall, Fagan, Minnich & McKee

[57] ABSTRACT

An electron beam lithography system and method which provide an in-plane current density distribution of an electron beam focussed onto a specimen so as to prevent a proximity effect and space charge effect.

17 Claims, 10 Drawing Sheets

FIG. 7A
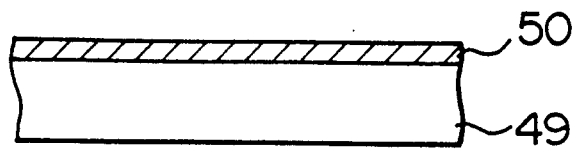
FIG. 7B
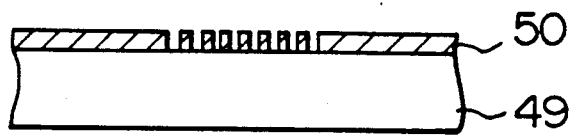
FIG. 7C
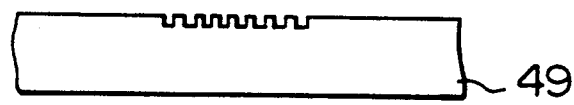
FIG. 7D
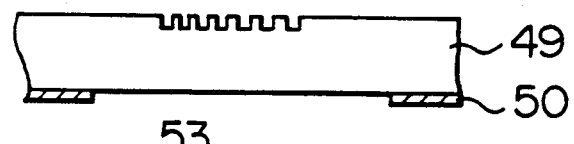
FIG. 7E
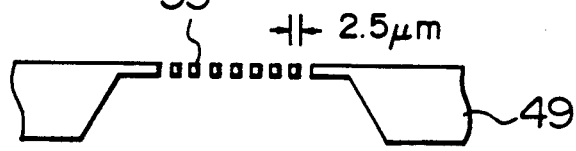
FIG. 8A
FIG. 8B
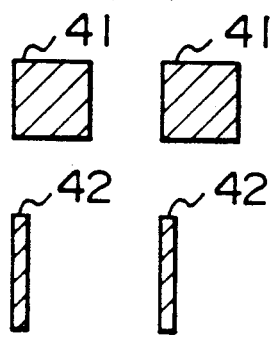
(THIS INVENTION)
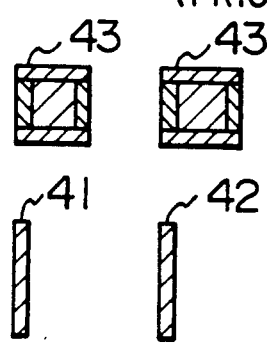
(PRIOR ART)

FIG. 14
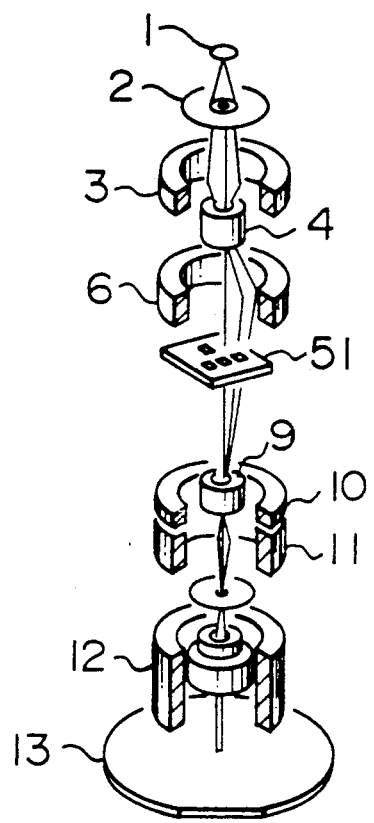
FIG. 15
FIG. 16
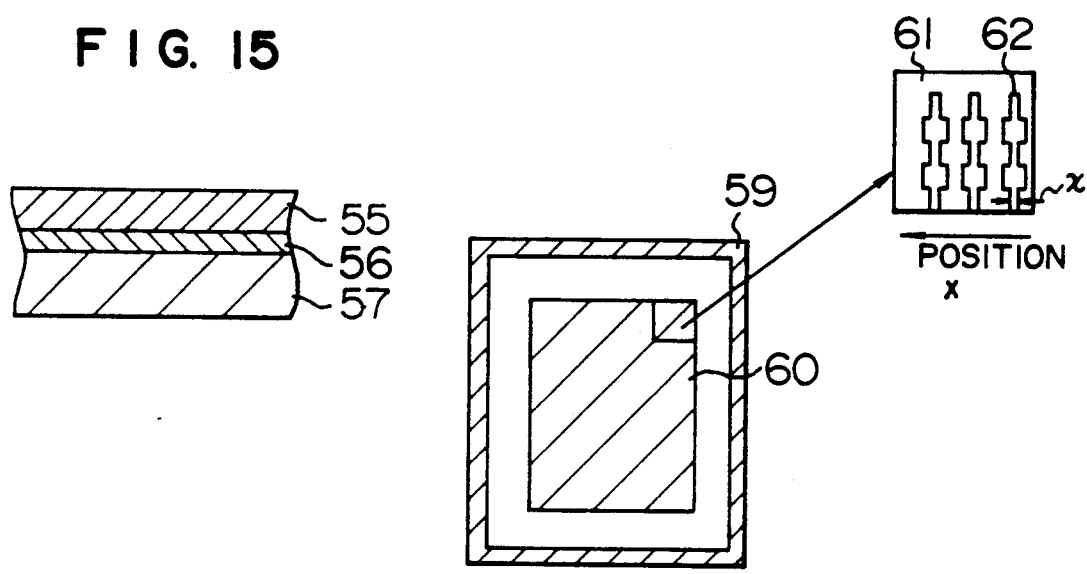

ELECTRON BEAM LITHOGRAPHY SYSTEM AND METHOD

BACKGROUND OF THE INVENTION

The present invention relates to electron beam lithography technology to be applied to LSI manufacturing processes, and to a lithography system and method aiming at manufacturing fine and highly integrated devices.

Integrated devices such as semiconductor memory devices are becoming finer and highly integrated more and more. Innovations on manufacturing technology, particularly lithography technology, are immense. The minimum work dimension of recent highly integrated devices is in the order of sub-micron. Lithography technology which can perform such a fine work is electron beam lithography technology. This electron beam lithography technology has a feature that it can process a finer pattern than other lithography technology such as optical type lithography technology. A typical example of electron beam lithography technology is disclosed in Japanese Patent Laid-Open Publication JP-A-59-169131. As shown in FIG. 1, a conventional electron beam lithography system is constructed of an electron gun 1 for generating an electron beam, two apertures 2 and 26 for shaping the beam in the form of square, lenses 3 and 5, deflectors 4, 27 and 28, a projection lens 11, and an objective lens 12. Electrons generated by the electron gun 1 are shaped by the first square aperture 2 to obtain a square shaped beam having a uniform current distribution which beam is then focussed on the second aperture 26 by the two lenses 3 and 5. The electron beam shaped by the second aperture 26 of a square shape or any desired shape is focussed onto a specimen 13 via the projection lens 11 and objective lens 12 to expose resist on the specimen.

In operation of the above-described conventional electron beam lithography system, an electron beam entered the resist is forward scattered, and the beam on the substrate surface is back scattered. Therefore, the resist area which should not be exposed is locally exposed, resulting in a so-called proximity effect. A degree of such scattering changes depending upon the material of a substrate and a pattern density. Therefore, even the patterns of the same design will have different dimensions after development, depending upon the densities of adjacent patterns and the substrate material. There is also associated with a problem that if the same pattern is repetitively drawn, the dimensions after development become different between the central areas and peripheral areas of the pattern. For repetitive patterns or patterns with various pattern densities used when manufacturing highly integrated devices, it is therefore impossible to obtain uniform dimensions as designed. In order to solve the above problems, parameters of pattern data have been conventionally changed in each lithography operation, such as changing the electron beam exposure time in accordance with a dimension or a pattern density. With this method, however, it is essential that the amount of pattern data is increased, resulting in a very long pattern preparatory time and drawing time.

Furthermore, with the above-described conventional electron beam lithography system, a great amount of transmitted electron beam energy is required for drawing a pattern having a large aperture area. As a result, the focus position of the electron optics displaces from the specimen surface, giving a so-called space charge effect. With a conventional method, if a large pattern is to be drawn, the pattern is divided into smaller patterns which are not influenced by the above-described effect, resulting in a necessity of a long time for drawing the patterns.

SUMMARY OF THE INVENTION

It is an object of the present invention to provide an electron beam lithography system and method capable of readily correcting the proximity effect.

It is another object of the present invention to provide an electron beam lithography system and method capable of readily correcting the space charge effect.

It is a further object of the present invention to provide an electron beam lithography system and method capable of drawing a pattern in a short time.

It is a still further object of the present invention to provide an electron beam lithography system and method which are less influenced by a pattern density and substrate material.

The above objects can be achieved by providing a certain in-plane current distribution of an electron beam to be focussed onto a specimen.

As the means for providing an in-plane current distribution of an electron beam, there is provided (a) cross striped shielding members having a stripe dimension finer than a resolution limit and disposed over the whole surface of, or at a particular area of, each aperture pattern of an aperture plate, or (b) coarse and fine cross striped pitches in some of the cross striped shielding member having a stripe dimension finer than a resolution limit and disposed at each aperture pattern of the aperture plate.

The principle of the present invention will be described below.

Consider the case where a pattern 40 shown in FIG. 2B is drawn by way of example. According to a conventional method, exposure is repetitively carried out using the apertures shown in FIG. 3. In this case, the accumulated energy within the resist at the central area and peripheral area of the pattern has a distribution shown in FIG. 2B taken along a position line 2—2 of pattern 40. This distribution results from the forward scattering of an electron beam and the back scattering by reflection from a substrate. The distribution changes depending upon the acceleration voltage of an electron beam and the material of a substrate. The accumulated energy within the resist is given by the product of a current density and an exposure time. For a conventional system which has a uniform current density within a beam, it is possible to solve the above problem by controlling the exposure time. However, in practice it is impossible to set a drawing time for each pattern.

As shown in FIG. 4, the focus point of electron optics changes with the beam dimension, i.e., the amount of transmitted current. Therefore, there arises a problem that if the focus point is adjusted using a small pattern, then blur occurs in a large pattern. It is therefore necessary to draw a pattern by dividing it into smaller patterns.

In view of the above circumstances, in the present invention, as shown in FIG. 5, cross striped shielding members 530 having a stripe dimension finer than a resolution limit are disposed over the whole area of, or over a particular area of, the aperture pattern of an aperture 29. Alternatively, coarse and fine cross striped pitches are provided for some of the cross striped shielding members. The current density of an electron beam transmitted through the aperture has a certain in-plane distribution. An in-plane current distribution is set by taking into consideration a substrate material, pattern configuration and the like with aperture 29 so that the above problem can be solved. Aperture patterns 30, 31, 32, 33, 34, and 35 have uniform in-plane transmittances of 100%, 90%, 80%, 70%, 60%, and 50%, respectively. It is possible to control the electron beam exposure amount at a wafer by properly selecting one of these aperture patterns, without changing the current density and exposure time of an electron beam radiated from an electron gun. The proximity effect can be corrected without controlling the exposure time, for example, by using an aperture pattern having a low transmittance for a pattern having a high pattern configuration density on a wafer and by using an aperture pattern having a high transmittance for a pattern having a low pattern configuration density on the wafer. Furthermore, for a complicated pattern having coarse and fine areas within a small area, an aperture pattern 36, 37 or 38 is used which has a coarse and fine cross striped pitch distribution.

These and other objects and many of the attendant advantages of the invention will be readily appreciated as the same becomes better understood by reference to the following detailed description when considered in connection with the accompanying drawings.

BRIEF DESCRIPTION OF THE DRAWINGS

FIGS. 7A to 7E are cross sections illustrating aperture forming processes;

FIGS. 8A and 8B are plan views showing examples of patterns to be drawn;

FIGS. 9, 14 and 19 are schematic diagrams showing lithography systems according to the present invention;

FIGS. 10 and 15 are cross sections of substrates to be worked, which have a polysilicon film and a tungsten film, respectively;

FIG. 16 shows a pattern layout of a 64M bit DRAM;

DESCRIPTION OF THE PREFERRED EMBODIMENTS

1st Embodiment

An embodiment of a variable-shaped type electron beam lithography system and method will be described, wherein an aperture for controlling a current density is provided between first and second square apertures.

Figure 6:
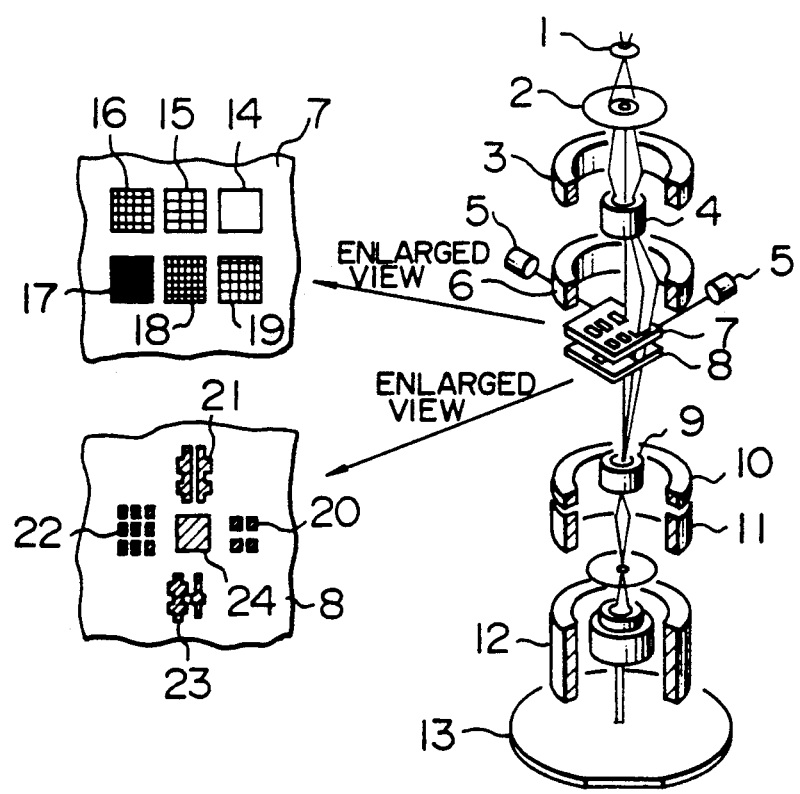
FIG. 6 is a schematic diagram of a lithography system according to the present invention.

FIG. 6 is a conceptual diagram of the system. This system is constructed of an electron gun for generating an electron beam, two apertures 2 and 8 for controlling the shape of the electron beam, an aperture 7 for controlling a current distribution, a deflector 4 for selecting an aperture pattern of the aperture, a transport mechanism 5, lenses 3 and 6, an adjustable lens 9, projection lenses 10 and 11, and an objective lens 12. The third aperture 7 for controlling a current density distribution is disposed over the second aperture 8.

The second aperture 8 includes cell projection patterns 20, 21, 22, and 23, and a pattern for a variable-shaped method. A conventional method using these patterns can correct the proximity effect only by controlling the exposure time.

In contrast, according to the present invention, the proximity effect can be corrected by controlling the current distribution. First, a method of manufacturing the aperture 7 for controlling the current density will be described. FIGS. 7A to 7E explain the manufacturing method. Resist 50 is coated on the surface of a silicon substrate 49 (FIG. 7A). A square mesh pattern or cross striped pattern is formed by an electron beam lithography method (FIG. 7B). After forming the pattern, the surface of the silicon substrate 49 is etched by a depth of 20 microns by means of a dry etching method (FIG. 7C). Thereafter, an opening pattern is formed at the bottom surface of the silicon substrate 49 (FIG. 7D), and by selective chemical etching, a silicon thin film area is formed to obtain a desired aperture 7 (FIG. 7E). Designing the width of a stripe of the cross striped pattern will be described with reference to FIG. 6. The width of a stripe is set to 0.1 micron on the surface of a specimen (in this case, silicon wafer) 13. The electron beam lithography system shown in FIG. 6 has a reduction ratio of 1/25. Therefore, the width of a stripe is set equal to or narrower than 2.5 micron. The cross striped pitch is made uniform for each of the aperture patterns 15, 16, 17, 18 and 19. There are prepared six types of aperture patterns having current transmittances of 50%, 40%, 30%, 20%, and 10%, including the full open aperture pattern 14. The dimension of the aperture pattern is set to 150 microns square larger than 125 microns square of the second aperture.

The aperture 7 is disposed over the second aperture 8 as shown in FIG. 6. One of the aperture patterns of the aperture 7 is mechanically selected by motors 6 mounted on the column.

Figure 4:
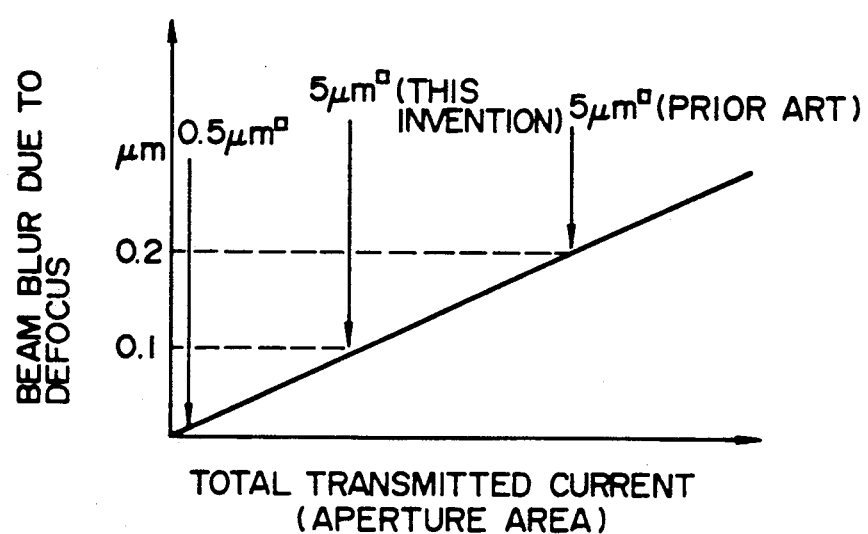
FIG. 4 illustrates a blur amount caused by the space charge effect.

Consider the case where patterns 41 (5 microns×5 microns) and 42 (7.5 micron×0.5 micron) shown in FIG. 8A are to be drawn. According to a conventional method, if the focus point of electron optics is set to a small pattern equal to or smaller than a 0.5 micron square, blur equal to or larger than 0.2 micron will be generated for a pattern of a 5 microns square, as seen from FIG. 4. It is impossible to change a focus point for each shot in practice. Therefore, a large pattern is required to be divided into a plurality of smaller squares in order to draw a pattern while reducing the size of blur to a value equal to or smaller than 0.1 micron. All patterns are required to be drawn using an electron beam equal to or smaller than 4 microns square. Therefore, as shown in FIG. 8B, the number of shots becomes twelve.

In contrast, according to the present invention, the aperture pattern 14 of the aperture 7 having the transmittance of 100% is selected for the fine pattern 42, and the aperture pattern 17 having the transmittance of 50% is selected for the large pattern 41. In the latter case, the total effective transmitted current amount is reduced by ¼, so that blur amount becomes 0.1 micron even for a pattern of 5 microns square as seen from FIG. 4. A pattern can be drawn without dividing it into smaller patterns, while reducing blur amount to a value equal to or smaller than 0.1 micron for both wide and narrow beam sizes. The number of shots is four which is one third of the conventional system. In this manner, the drawing time can be shortened considerably.

2nd Embodiment

Figure 9:
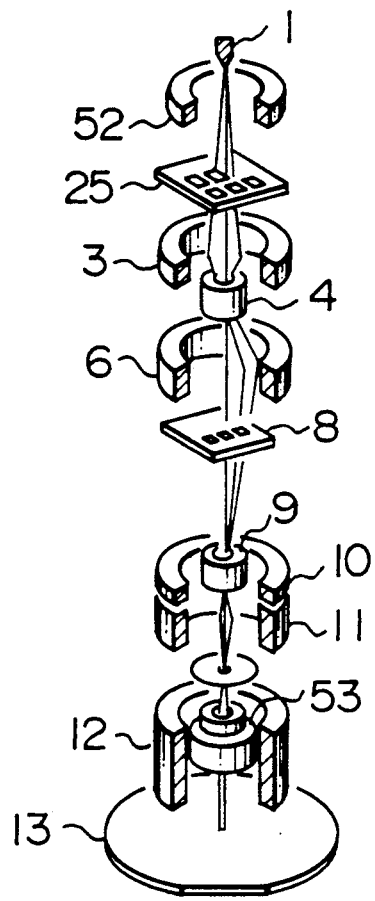

In the first embodiment, the third aperture 7 has been provided. The same effect can be obtained by implementing means for controlling an in-plane current density distribution of an electron beam with the first square aperture. An aperture 25 having a plurality of square aperture patterns shown in FIG. 9 is manufactured by the same method of the first embodiment. The aperture patterns of this aperture 25 are equivalent to those of the aperture of the first embodiment. The transmittances of the aperture patterns are set to the same values as the first embodiment. In drawing the patterns shown in FIG. 8A by the variable-shaped method, the square aperture pattern 30 with the transmittance of 100% is selected by the deflector for drawing the narrow pattern 42 having the side length of 0.5 micron, whereas the aperture pattern 35 with the transmittance of 50% is selected by the deflector 52 for drawing the larger pattern 41. The same results as the first embodiment were obtained.

3rd Embodiment

Figure 2B:
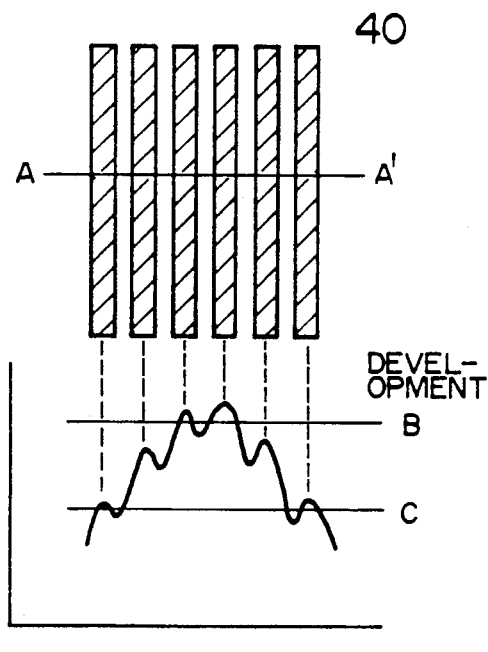
FIGS. 2A and 2B show an example of a drawn pattern and the accumulated energy within resist at the cross section taken along line A—A'.

An embodiment will be described for drawing the line-space pattern 40 shown in FIG. 2B. If this pattern is drawn using a conventional lithography method, the resist dimensions at the peripheral area and central area become different from each other even by using the same amount of applied current. FIG. 2B shows the accumulated energy at the cross section taken along line 2—2 of the line-space pattern. If this pattern is developed, the central two lines can be resolved and the remaining four lines disappear, respectively at a development time B. At a shorter development time C, although the two lines at opposite ends can be resolved, the central four lines cannot be resolved.

Figure 5:
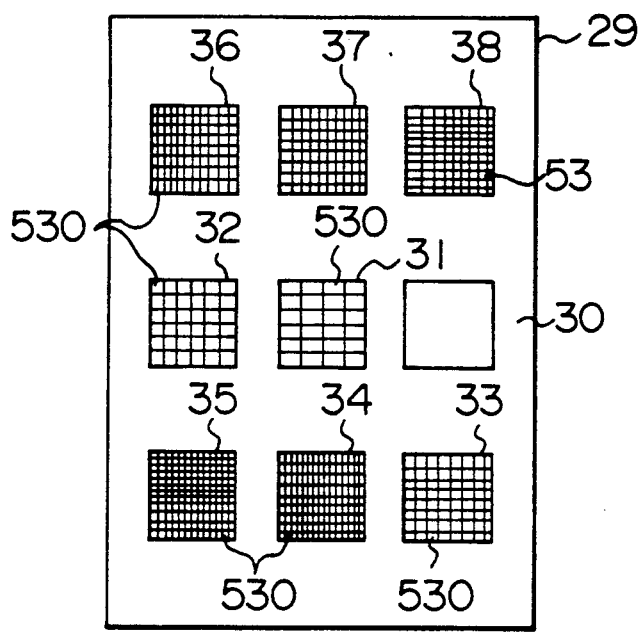
FIG. 5 is a plan view of an aperture which provides various current distributions.

In this embodiment, a lithography system like that shown in FIG. 9 is used. The first square aperture 25 is provided with the aperture patterns same as the first embodiment, and a plurality of other aperture patterns to be described below, including the apertures 37 and 36 shown in FIG. 5 and manufactured by the method described with the first embodiment. The aperture 37 has a transmittance of 50% at the right side and 90% at the left side, gradually increasing in the left direction. The aperture 36 has a reversed transmittance distribution relative to the aperture 37. The transmittance change amount depends on the acceleration voltage of an electron beam, a substrate material, and the like. The transmittance distribution curve indicated by a broken line in FIG. 11 was used in drawing a pattern on a specimen having a tungsten film shown in FIG. 10 at an acceleration voltage of 30 kV. The second aperture 8 is formed with the aperture pattern 39 shown in FIG. 5.

Figure 2A:
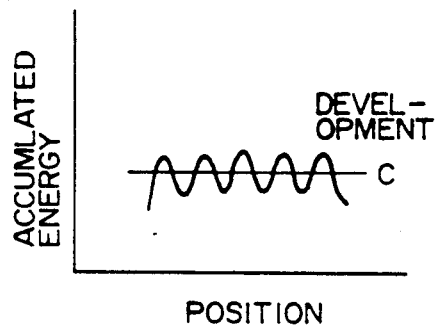
Figure 3:
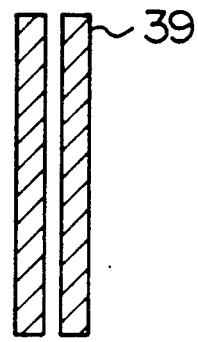
FIG. 3 is a diagram showing an aperture pattern.

First, the deflector 52 selects the aperture pattern 37 of the first aperture 25 to focus an electron beam having a current distribution defined by the aperture 37 onto the aperture pattern 39 of the second aperture 8 so that the pattern is drawn on the wafer 13. Next, the deflector 52 selects the uniform aperture pattern 35 having a transmittance of 50% to focus an electron beam having a uniform current distribution onto the aperture pattern 39 so that the pattern is drawn by the deflector 53 at the right side of the previously drawn pattern. Lastly, the deflector 52 selects the aperture pattern 36 to draw the pattern at the right side of the pattern drawn immediately before. In this manner, the accumulated energy within the resist takes a uniform distribution on each line over the whole area of the pattern at a development time C as shown in FIG. 2A. Upon development of this wafer, the dimension of each line was obtained as designed.

4th Embodiment

Figures 12A, 12B:
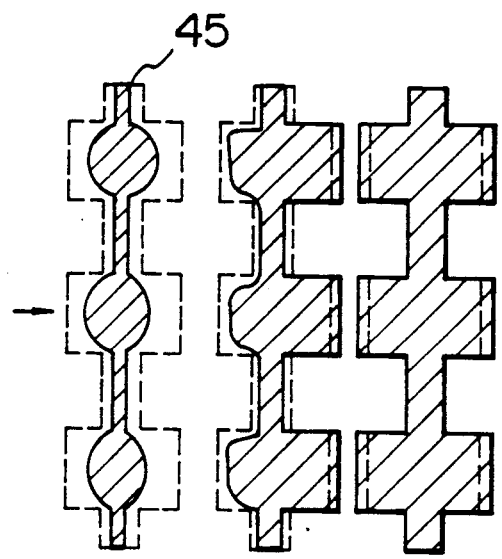
FIGS. 12A, 12B and 13 are plan views showing apertures and patterns to be drawn.
Figure 13:
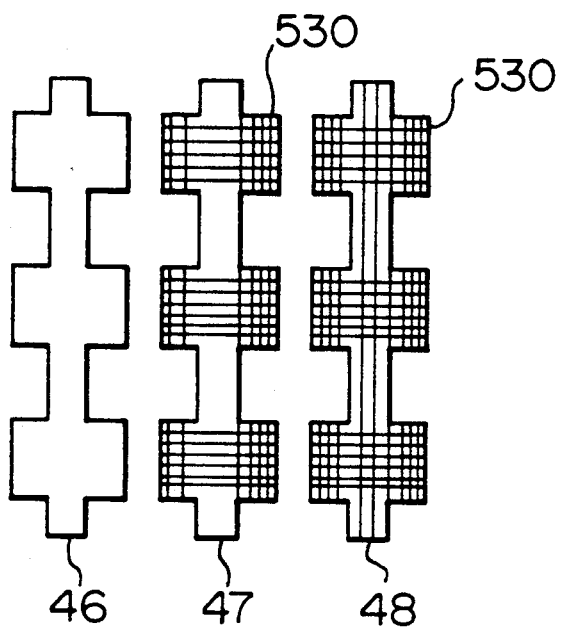

An embodiment will be described wherein aperture patterns for providing a current distribution are formed on the second aperture. FIG. 12A shows a complicated pattern 44. FIG. 12B shows that the shape of a second aperture 44 and the resist patterns 45 after continuously drawing and development do not coincide with one another, because of the proximity effect of the complicated pattern. In order to correct the proximity effect, aperture patterns 46, 47, and 48 shown in FIG. 13 each having different cross striped shielding members or meshes 530 are formed on the second aperture 51. The method of forming these aperture patterns is the same as the first embodiment. The transmission distribution to be caused by the aperture pattern is designed by simulation using an acceleration voltage of an electron beam, a substrate material, and the like. The aperture patterns are selectively used to realize a drawn pattern not influenced by the proximity effect. Specifically, the problem of the proximity effect can be solved by using the aperture pattern 46 or 47 for the peripheral area of the whole pattern layout and the aperture pattern 48 for the central area of the pattern layout.

5th Embodiment

An embodiment will be described wherein the present invention is applied to manufacturing semiconductor memories.

Figure 1:
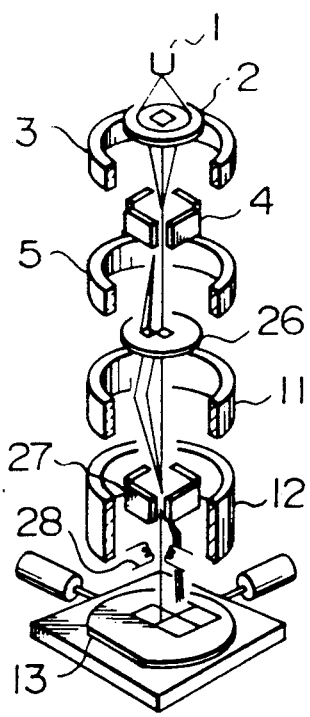
FIG. 1 is a schematic diagram showing a conventional lithography system.
Figure 10:
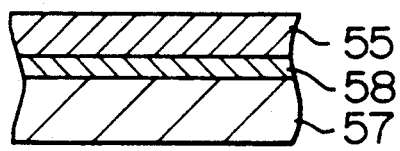
Figure 11:
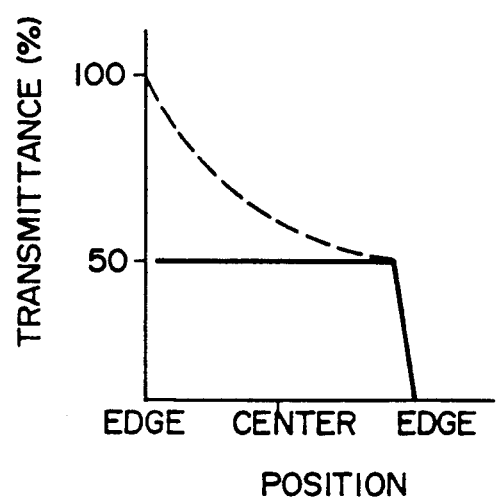
FIG. 11 is a graph showing a transmittance distribution within an aperture pattern.
Figure 17:
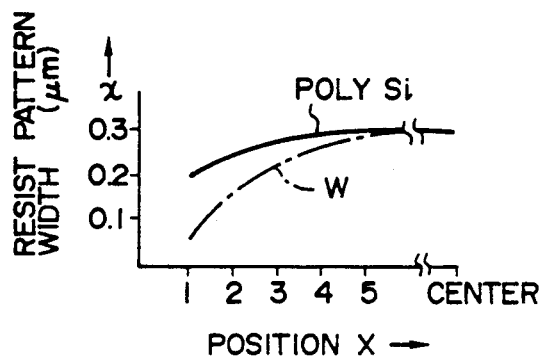
FIG. 17 is a graph showing a distribution of line widths within a memory mat.
Figure 18:
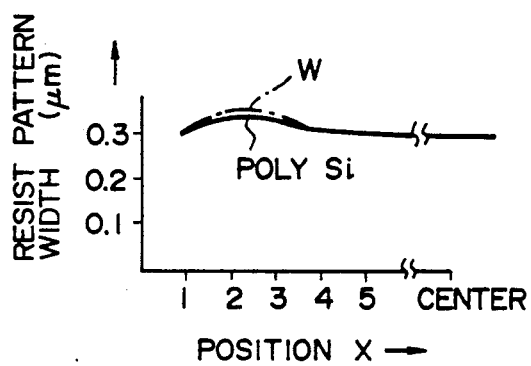
FIG. 18 is a graph showing a distribution of line widths after exposure correction.

In this embodiment, as a wiring pattern for a 64M bit DRAM, the pattern 44 shown in FIG. 12A is used, and as a work layer the polysilicon film 56 shown in FIG. 15 and the tungsten film 58 shown in FIG. 10 are used. As shown in FIG. 16, the pattern 44 of the 64M bit DRAM is constituted by a memory mat 60 having a repetition of a same pattern and a peripheral circuit 59 adjacent the memory map. First, there will be described the case wherein a conventional variable-shaped type electron beam lithography system shown in FIG. 1 is used. In drawing a pattern using this system, the pattern is divided into smaller square patterns so that the number of shots becomes large, increasing the drawing time. Furthermore, the outermost periphery of the memory mat 60 is influenced by the proximity effect. Therefore, the area, inside of the outermost periphery by 2 to 3 microns, of the resist pattern 45 after development becomes under-exposure than the inner area, so that the resist pattern becomes thinner as shown in FIG. 12B. This phenomenon becomes more conspicuous if the material of the work layer is made of heavy elements because of greater influence by the back scattering of an electron beam. The resist pattern width relative to the pattern position is shown in FIG. 17, for a polysilicon film having relatively light elements as the work layer, and for a tungsten film having relatively heavy elements as the work layer. In order to alleviate the influence of the proximity effect, it is necessary to correct the exposure amount at the peripheral area. As one method of correcting the exposure amount, there is a method whereby the peripheral area is exposed two times. The corrective exposure dosage at the second time is 10% of the main exposure dosage in the case of the polysilicon film, and about 30% in the case of the tungsten film. The results of this correction are shown in FIG. 18. However, the exposure time further increases for the both films, taking 20 minutes or longer for one chip. In contrast with this, according to the cell projection method shown in FIG. 14, memory cells for several bits can be exposed by one exposure so that the drawing time can be reduced to 10 seconds or shorter. However, even with this method, the proximity effect is present as in the above case. Therefore, if the corrective exposure is performed for the peripheral area by the variable-shaped method, the drawing time about 30 seconds becomes necessary which is longer than the main exposure time.

The embodiment according to the present invention will then be described.

Figure 19:
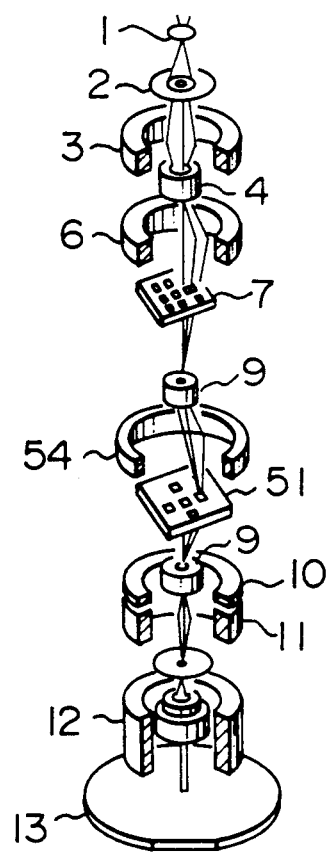
Figure 20:
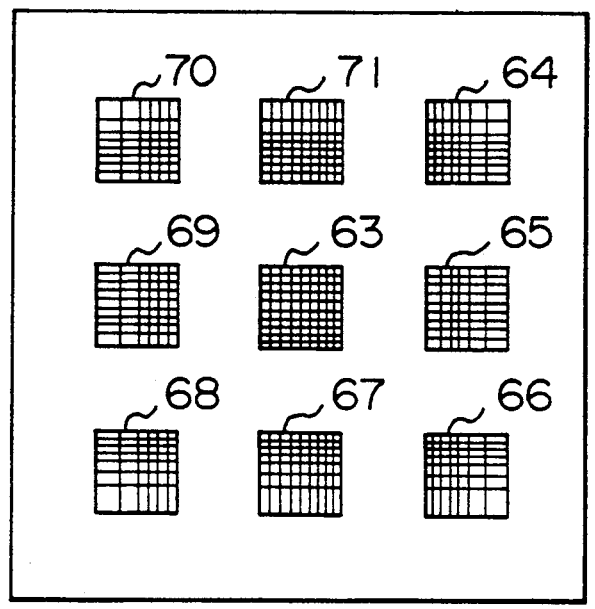
FIG. 20 shows a pattern layout of a third aperture.

The aperture 7 for providing a current density distribution is mounted between the first aperture 2 and second aperture 51 as shown in FIG. 19. The arrangement of the third aperture is shown in FIG. 20. A square opening is formed in the second aperture 5, with cell patterns for respective layers of a semiconductor memory being disposed in the area within the square opening. The third aperture 7 is formed at the central area thereof with uniform square aperture pattern 63 having a low transmittance, and a plurality of aperture patterns around the pattern 63 each having a higher transmittance as the position becomes more remote from the central area. For example, the square pattern 64 at the upper right has a higher transmission distribution as the position goes further toward the upper right. The square pattern 71 at the upper center has a higher transmission distribution as the position goes further toward the upper center. These aperture patterns are formed by working silicon in the similar manner as the first embodiment. Selection of one of the aperture patterns is carried out by electromagnetic deflection.

Figure 21:
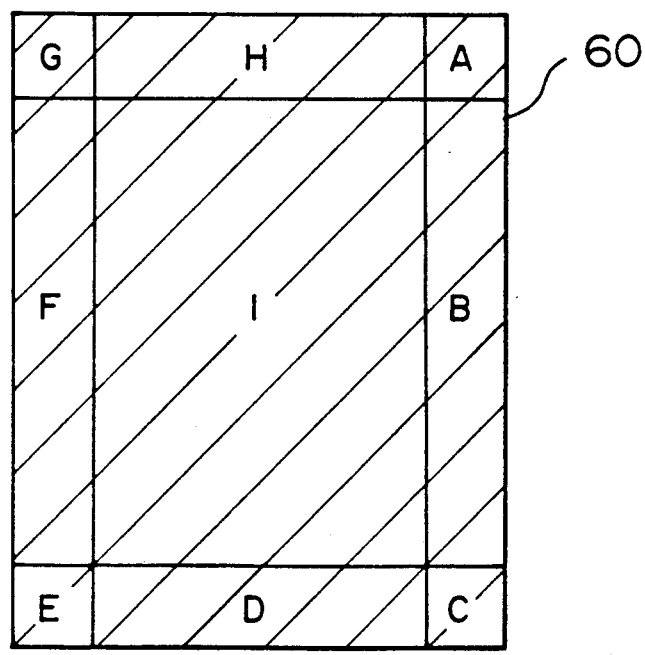
FIG. 21 is a diagram showing an example of area division of a memory mat.

First, a wiring layer pattern is selected from the second aperture 51 by means of an electromagnetic deflector 54. Next, in drawing an area A of memory mat 60 shown in FIG. 21, the aperture pattern 64 having the transmittance distribution as shown is selected by an electromagnetic deflector 6. Thereafter, the electromagnetic deflector 6 sequentially selects the aperture patterns 65, 66, 67, 68, 69, 70, 71, and 63 corresponding to areas B, C, D, E, F, G, H, and I to draw the patterns.

Figure 22:
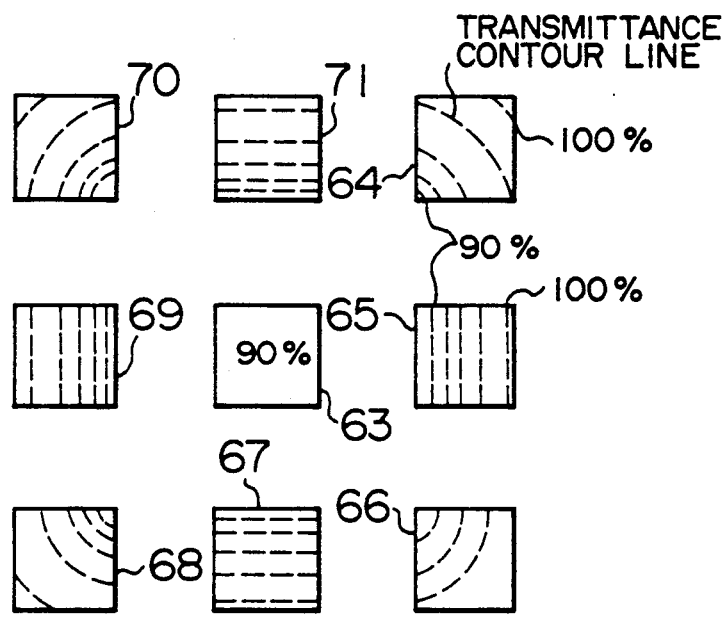
FIGS. 22 and 23 are diagrams showing the transmission distribution of each square aperture pattern of the third aperture for working a polysilicon film and a tungsten film, respectively, the distribution being represented by using contour lines.
Figure 23:
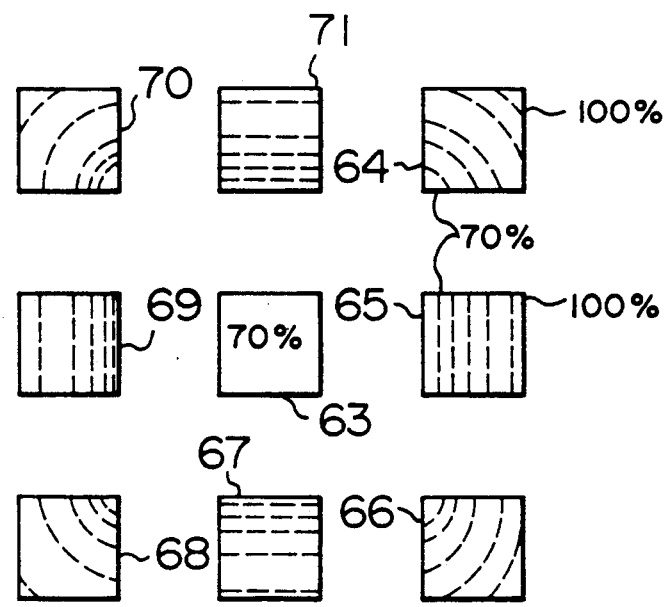

The transmittance distributions for a polysilicon film and tungsten film were used which are shown in FIGS. 22 and 23, respectively.

The dimension variation of the resist pattern obtained in this manner was substantially the same within 0.05 micron fluctuation at any point within the memory mat 60. The drawing time was 10 seconds or shorter for one chip.

The influence of the proximity effect differs depending upon the material of an upper-layer substrate and a pattern density. Therefore, in order to correct the proximity effect, it becomes necessary to set a proper exposure dosage for each pattern. According to the conventional method, the exposure dosage has been set by controlling an exposure time for each pattern. Therefore, the amount of pattern data becomes bulky, and the drawing time increases. In contrast, according to the present invention, an aperture pattern suitable for correcting the proximity effect is selected from aperture patterns having various types of current density distributions, in order to deal with the proximity effect. It is therefore possible to correct the proximity effect without increasing the amount of pattern data and a drawing time.

Although the present invention has been described as related to an electron beam lithography system, the same effect can be obtained even a charge particle beam other than an electron beam is used.

It is further understood by those skilled in the art that the foregoing description is preferred embodiments of the disclosed system and method and that various changes and modifications may be made in the invention without departing from the spirit and scope thereof.

What is claimed is:

1. An electron beam lithography method, comprising the steps of:
    emitting an electron beam in a fixed predetermined dosage;
    repeating drawing a unit pattern with said electron beam on a substrate wherein a plurality of said unit patterns forms a highly integrated device pattern;
    forming said unit pattern by shaping the electron beam with a first aperture having an aperture pattern matching said unit pattern; and
    varying a transmittance of the electron beam with at least one second aperture to selectively control an intensity of an exposure dosage of the electron beam on said substrate.

2. A method of forming a pattern according to claim 1, wherein in said drawing of a unit pattern step that forms a highly integrated device pattern, said highly integrated device pattern has central and peripheral areas and said step of varying a transmittance of the electron beam varies the intensity of the exposure dosage of the electron beam within said central and peripheral areas.

3. A method of forming a pattern according to claim 1, wherein in said varying step a plurality of said second apertures are used, each said aperture having a different intensity distribution.

4. A method of forming a pattern, comprising:
    coating a resist film on a semiconductor substrate;
    forming a highly integrated circuit pattern by exposing said resist film repeatedly with a unit pattern in individual shots using energy beam lithography emitted from a source in a fixed predetermined dosage for each shot; and
    controlling the transmitted beam energy with at least one aperture to vary the transmittance for said shots.

5. A method of forming a pattern according to claim 4, wherein the highly integrated circuit pattern has central and peripheral areas and in the step of controlling the transmitted beam energy, the transmittance is varied to have a high transmittance about said peripheral area and to have a low transmittance about said central area of said integrated device pattern.

6. A method of forming a pattern according to claim 4, wherein in said controlling step, an electron beam is used as said energy beam and said electron beam is selectively passed through one of a plurality of apertures that includes at least a first aperture having a uniform cross stripe pitch and a second aperture having both a coarse cross stripe pitch and a fine cross stripe pitch.

7. A method of forming a pattern according to claim 4, wherein further in said controlling step said electron beam is selectively passed through a first centrally disposed aperture having a low transmittance and a plurality of additional apertures disposed peripherally of said centrally disposed aperture having a transmittance that increases from low transmittance in portions near the centrally disposed aperture to high transmittance in portions disposed farthest therefrom.

8. An electron beam lithography method, comprising the steps of:
forming a highly integrated circuit pattern on a resist film coated on a semiconductor substrate from a plurality of unit patterns;
emitting an electron beam in a fixed dosage emission of predetermined current density and duration an shaping the beam by passing the beam through a first aperture having a cell projection pattern in the shape of the unit pattern;
repeatedly exposing the coated substrate with said shaped electron beam; and
controlling said exposing by passing said electron beam through one of a plurality of second apertures to vary an in-plane current distribution of said shaped electron beam for each shot in accordance with predetermined parameters.

9. An electron beam lithography method according to claim 8, wherein said controlling step controls an in-plane current distribution to be uniform.

10. An electron beam lithography method according to claim 8, wherein in said controlling step, said in-plane current distribution is controlled from one side of said shaped electron beam to the other.

11. An electron beam lithograph method according to claim 8, wherein said controlling step controls the in-plane current distribution in accordance with a material of the semiconductor substrate and a pattern configuration of the cell projection pattern as two of said predetermined parameters.

12. An electron beam lithography method according to claim 8, wherein in said controlling step said electron beam is selectively passed through a centrally disposed aperture having a low transmittance when said exposing exposes said central area and a plurality of additional apertures disposed peripherally of said centrally disposed aperture having a transmittance that increases from low transmittance in portions near the centrally disposed aperture to high transmittance in portions disposed farthest therefrom when said exposing exposes said peripheral area.

13. An electron beam lithography method, comprising the steps of:
shaping an electron beam emitted from a source in a fixed predetermined dosage and duration by selecting one of a plurality of cell projection patterns each having a like unit pattern that forms part of a highly integrated circuit device pattern and each having a different transmittance affecting an exposure dosage of the electron beam;
repeatedly exposing a substrate with the electron beam in the shape of the unit pattern, including exposing a first area of the device pattern with the electron beam shaped by a first one of said plurality of cell projection patterns providing low transmittance and exposing a second area of the device pattern with the electron beam shaped by at least a second one of said plurality of cell projection patterns providing high transmittance.

14. An electron beam lithography method according to claim 13, wherein said exposing the substrate step includes exposing a central area of the device pattern as said first area and exposing a peripheral area of the device pattern as said second area.

15. An electron beam lithography method according to claim 13, wherein in said exposing step said electron beam is selectively passed through said one of the cell projection apertures that is centrally disposed with respect to the electron beam that has high transmittance and through a plurality of additional cell projection apertures, as said at least one second cell projection aperture, that are disposed peripherally of said centrally disposed aperture and that have a transmittance that increases from low transmittance in portions near the centrally disposed aperture to high transmittance in portions disposed farthest therefrom.

16. A method of forming a highly integrated circuit pattern having central and peripheral areas on a resist film coated on a semiconductor substrate using electron beam lithography, comprising:
emitting an electron beam from a source in a fixed dosage and duration and shaping the electron beam with an aperture defining a unit pattern of said circuit pattern;
repeatedly exposing the resist with a single shot electron beam of fixed dosage shaped by said aperture to form the circuit pattern;
controlling the transmittance of the electron beam after the emitting to have a high transmittance about said peripheral area of said integrated device pattern and to have a low transmittance about said central area of said integrated device pattern.

17. A method of forming a highly integrated circuit pattern according to claim 36, wherein in said controlling step said electron beam is selectively passed through one of a plurality of transmittance affecting apertures having different transmittances, respectively.

* * * * *